United States Patent [19]
Chen et al.

[11] Patent Number: 5,963,091
[45] Date of Patent: Oct. 5, 1999

[54] ARTICLE COMPRISING A POWER AMPLIFIER WITH FEED FORWARD LINEARIZER USING A RLS PARAMETER TRACKING ALGORITHM

[76] Inventors: Jiunn-Tsair Chen, 246 Somerset St., New Brunswick, N.J. 08901; Huan-Shang Tsai, 130 New Rd., Parsippany, N.J. 07054

[21] Appl. No.: 09/053,469

[22] Filed: Apr. 1, 1998

[51] Int. Cl.⁶ .................................................. H03F 1/00
[52] U.S. Cl. ........................................... 330/151; 330/149
[58] Field of Search ................................. 330/151, 149; 332/107

[56] References Cited

U.S. PATENT DOCUMENTS

| 5,049,832 | 9/1991 | Cavers | 330/149 |
| 5,489,875 | 2/1996 | Cavers | 330/151 |
| 5,508,657 | 4/1996 | Behan | 330/151 |
| 5,617,061 | 4/1997 | Fukuchi | 330/151 |
| 5,789,976 | 8/1998 | Ghannouchi et al. | 330/52 |
| 5,808,512 | 9/1998 | Bainvoll et al. | 330/151 |

OTHER PUBLICATIONS

L. Sundstrom, m. Faulkner, M. Johansson, "Quantization analysis and design of a digital predistortion linearizer for RF power amplifiers," *IEEE Trans. on Veh. Tech.*, vol. 45, No. 4, pp. 707–719, Nov. 1996.

Grant, S.J., et al., "A DSP controlled adaptive feedforward amplifier linearizer," *5th International Conference on Universal Personal Communications*, Cambridge. MA, 1996, vol. 2, pp. 788–792.

M.A. Briffa, M. Faulkner, "Stability analysis of Cartesian feedback linearization for amplifiers with weak non–linearities," *IEEE Trans. on Microwave Theory and Tech.*, vol. 45, No. 1, pp. 212–218, Aug. 1996.

E.E. Eid, F. M. Ghannouchi, "Adaptive nulling loop control for 1.7–GHz feedforward linearization systems," *IEEE Trans. on Microwave Theory and Tech.*, vol. 45, No. 1, pp. 83–86, Jan., 1997.

G. Zhao, F.M. Ghannouchi, F. Beauregard, A.B. Kouki, "Digital implementations for adaptive feed–forward amplifier linearization techniques," *IEEE MT–S International Microwave Symposium Digest*, New York, vol. 2 of 3, pp. 543–546, 1996.

*Primary Examiner*—Robert Pascal
*Assistant Examiner*—Henry Choe

[57] ABSTRACT

A feedforward linearizer for amplifying an input signal comprises a signal cancellation circuit which has a first branch and a second branch. A first amplifier provided in the first branch receives the input signal intended to be amplified and generates an output signal received by a signal cancellation vector modulator. A signal cancellation adder receives the signal generated by the signal cancellation vector modulator and the input signal via the second branch and provides an error signal. The feedforward linearizer also comprises an error cancellation circuit that has a first branch and a second branch. An error cancellation adder in the first branch receives the output signal provided by the first amplifier and generates the output signal of the linearizer. An error cancellation vector modulator in the second branch receives an error signal provided by the signal cancellation adder and provides an error adjusted signal to a second auxiliary amplifier. The second auxiliary amplifier provides an input signal to the error cancellation adder. A digital signal processor, comprising a signal processing circuit, provides a signal cancellation adjustment signal, $\alpha$, to the signal cancellation vector modulator and an error cancellation adjustment signal, $\beta$, to the error cancellation vector modulator, such that the output signal of the signal cancellation adder is a signal that substantially represents the error components provided by the first amplifier, and the output signal of the error cancellation adder is an amplified version of the input signal, with substantially no intermodulation components.

16 Claims, 4 Drawing Sheets

ARTICLE COMPRISING A POWER AMPLIFIER WITH FEED FORWARD LINEARIZER USING A RLS PARAMETER TRACKING ALGORITHM

FIELD OF THE INVENTION

This invention relates to a wideband power amplifier and specifically to an amplifier having a feed-forward linearizer arrangement employing digital signal processing techniques.

BACKGROUND OF THE INVENTION

In many radio frequency, RF, applications power amplifiers are employed to amplify high frequency signals. Because the RF amplifiers are biased to provide substantially high output power, they exhibit nonlinear responses to some degree. Consequently, in response to an increase in the input signal power, such RF amplifiers generate intermodulation IM components, which may have frequencies that are outside a desired frequency band.

One solution to eliminate the consequences of the nonlinear response of the amplifier is to employ multiple amplifiers each configured to amplify a predetermined carrier signal. For example, in a mobile communications environment, the base station sends multiple carrier signals in accordance with time division multiple access (TDMA) modulation scheme, or in accordance with code division multiple access (CDMA) modulation scheme. Each carrier frequency in TDMA corresponds to one of the users in a specifiable cell. Each pseudo-code in CDMA corresponds to one user. Because the base station has to communicate with many users in the corresponding cell, the intermodulation IM components increase with the number of the users. Thus, the use of a separate amplifier for each carrier signal substantially eliminates the generation of intermodulation IM components. However, this approach is costly and may not be commercially feasible in many applications.

Another approach is to employ an analog linearizer, such as 10 as illustrated in FIG. 1. The operation of linearizer in conjunction with an exemplary two-tone signal is described hereinafter. Basically, a radio frequency signal represented by frequency components 22 is fed to a power amplifier 12. Amplifier 12 generates additional intermodulation IM frequency components 24 because of its nonlinear response characteristics. Signal components 22' correspond to an amplified version of signal components 22. The function of linearizer 10 is to substantially eliminate frequency components 24, as explained in more detail below.

Linearizer 10 includes a signal cancellation circuit 26 coupled to an error cancellation circuit 28. Signal cancellation circuit 28 has an upper branch that includes power amplifier 12, and a lower branch that provides the input signal of the linearizer to an input port of an adder 16. The other input port of adder 16 is configured to receive the output signal generated by power amplifier 12, via an attenuator 14. As a result, the output port of adder 16 provides signal components 24', which correspond to the attenuated version of intermodulation IM frequency components 24.

Error cancellation circuit 28 also includes an upper branch that is configured to provide the output signal generated by amplifier 12 to an adder 20. The lower branch of error cancellation circuit 28 includes an amplifier 18, which is configured to receive the attenuated intermodulation components 24'. Amplifier 18 generates an amplified version of signal 24' which is substantially equal to intermodulation component 24. As a result, the output port of adder 20 provides signal components 22' without the distortion caused by the amplifier The feedforward linearizer described in FIG. 1 has some disadvantages. For example, because it is based on analog circuitry, it cannot quickly adapt to signal changes. Other design solutions to accomplish linearization include pre-distortion linearizer arrangement and feed-back linearizer arrangement. However these designs do not provide acceptable processing. Furthermore, feed-back linearizers often lead to signal instability.

In order to avoid the problems associated with analog feedforward linearizers, feedforward linearizer employing digital signal processing techniques have been proposed which adaptively adjust some control parameters (or adjustment signal) in the circuit to accommodate the change in signal and environment. However, slow-convergence on the adaptation of the adjustment signals in the proposed solutions, restricts the effectiveness of such feedforward linearizers.

Thus, there is a need for a feedforward linearizer that employs digital signal processing techniques and that provides effective suppression of intermodulation components and fast convergence.

SUMMARY OF THE INVENTION

In accordance with one embodiment of the invention, a feedforward linearizer is employed to amplify an input signal. The linearizer includes a signal cancellation circuit and an error cancellation circuit. The signal cancellation circuit includes a power amplifier that is employed to amplify the input signal. The output of the power amplifier is adjusted by a vector modulator that provides adjustment signals. A recursive least square, RLS, calculator calculates these adjustment signals based on a recursive least square algorithm. In accordance with one embodiment of the invention, the recursive least square algorithm functions such that the error signal provided by the signal cancellation circuit is substantially orthogonal to the input signal to the linearizer.

Furthermore, in accordance with another embodiment of the invention, the transfer function of the vector modulator is configured such that $$\frac{dG}{dV} \le \frac{G}{V}$$

wherein G is the gain of the vector modulator and V is the input signal to the modulator and $$\frac{1}{2} \le \frac{d\phi}{d\theta} \le 2$$

wherein φ is the phase of the input signal to the vector modulator and θ is the phase of the output signal of the vector modulator.

In accordance with another embodiment of the invention, the signal cancellation circuit having a first signal cancellation branch and a second signal cancellation branch. The first signal cancellation branch includes an amplifier that is configured to receive the input signal intended to be amplified. The output port of the amplifier is coupled to a signal cancellation vector modulator via an attenuator. The output port of the vector modulator is coupled to a signal cancellation adder. The other input of the signal cancellation adder is configured to receive the input signal via the second signal cancellation branch. The feedforward linearizer also includes an error cancellation circuit having a first error cancellation branch and a second error cancellation branch. The first error cancellation branch includes an error cancellation adder configured to receive the output signal generated by said amplifier. The second error cancellation branch includes an error cancellation vector modulator adapted to receive the signal generated by the signal cancellation adder and provide an adjusted error signal to an error cancellation vector modulator. The output port of error cancellation modulator is provided to an auxiliary amplifier, which in turn provides its output signal to the second input port of the error cancellation adder. A digital signal processor is configured to provide a gain and phase adjustment signal to the vector modulators such that the output signal of the signal cancellation adder is a signal that substantially represents the intermodulation components, and the output signal of the error cancellation adder is an amplified version of the input signal, with substantially no intermodulation components.

In accordance with another embodiment of the invention, the processor receives signal samples representing a baseband version of input signal, $V_m$, to the amplifier, the output signal, $V_0$, of the linearizer and the error signal, $V_d$, generated by signal cancellation adder. The processor also includes a Root Least Square calculator that is configured to track $1/\alpha$ parameter, where, $\alpha$ is the signal cancellation adjustment signal, such that the norm of $V_d/\alpha$ is minimized.

The processor performs its calculation based on the down converted signals corresponding to the input signal, the output signal provided by the signal cancellation adder and the output signal of the linearizer.

BRIEF DESCRIPTION OF THE DRAWINGS

The subject matter regarded as the invention is particularly pointed out and distinctly claimed in the concluding portion of the specification. The invention, however, both as to organization and method of operation, together with features, objects, and advantages thereof may best be understood by reference to the following detailed description when read with the accompanying drawings in which:

DETAILED DESCRIPTION OF THE DRAWINGS

Figure 1:
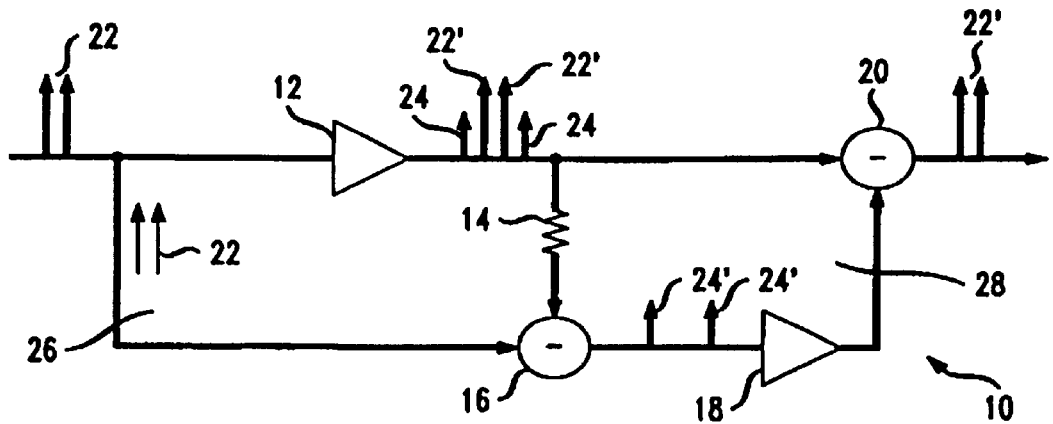
FIG. 1 illustrates a prior art analog feedforward linearizer.
Figure 2:
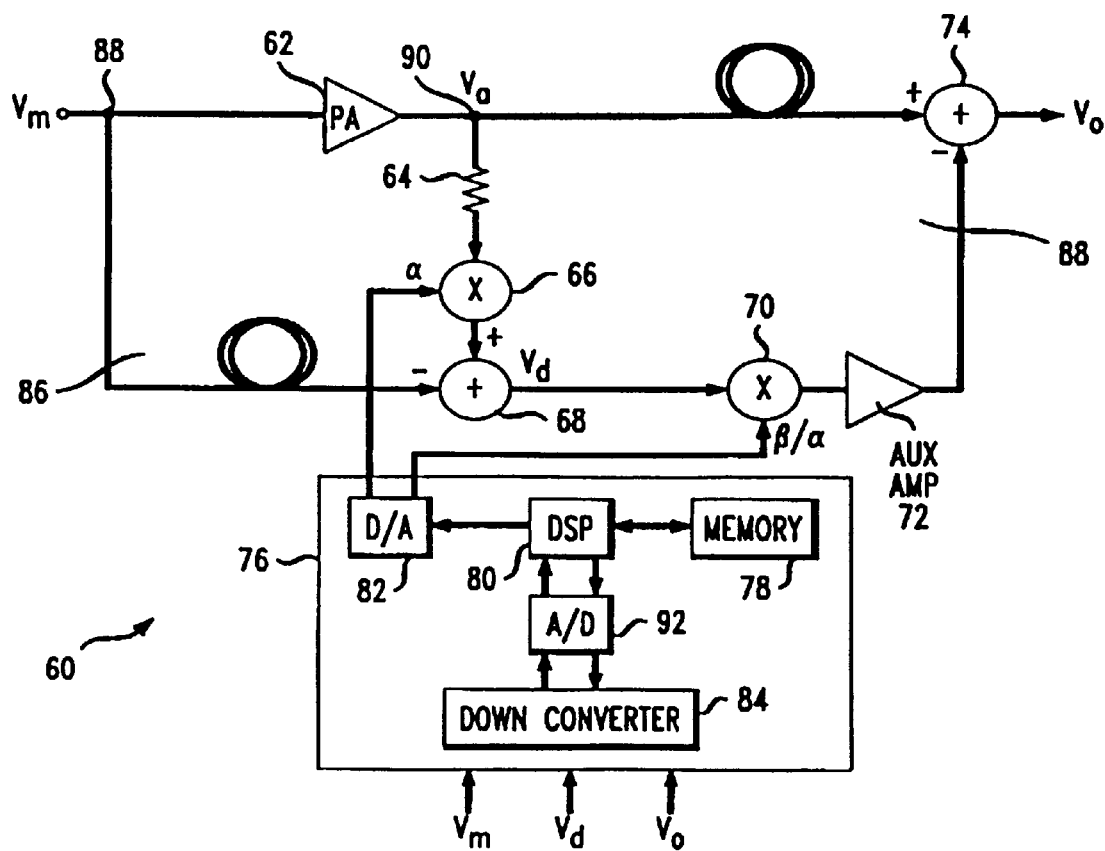
FIG. 2 illustrates a feedforward linearizer in accordance with one embodiment of the invention.

FIG. 2 illustrates a wideband power amplifier feedforward linearizer 60 in accordance with one embodiment of the invention, although the invention is not limited in scope to this embodiment.

Linearizer 60 includes a signal cancellation circuit 86 and an error cancellation circuit 88. Each of the cancellation circuits 86 and 88 have two branches. Thus, signal cancellation circuit 86 includes a first signal cancellation branch that contains an amplifier 62, which is configured to receive an input signal $V_m$. Input signal $V_m$ is also diverted to a second signal cancellation branch via a signal splitter 88.

The first signal cancellation branch also includes a signal cancellation vector modulator 66, which is configured to receive the signal generated by amplifier 62 via a splitter 90 and an attenuator 64. Attenuator 64 may advantageously be a resistor having an attenuation factor. An output port of vector modulator 66 is coupled to an adder 68. The other input port of adder 68 is configured to receive the input signal, $V_m$, via the second signal cancellation branch.

Vector modulator 66 is configured to receive a signal cancellation adjustment signal, $\alpha$, such that, after adjustment, the output signal, $V_d$, at the output of adder 68 substantially orthogonal to the input signal, $V_m$, as will be explained in more detail.

The output port of amplifier 62 is also coupled to a first error cancellation branch of linearizer 60 via signal splitter 90. Thus, this error cancellation branch includes an error cancellation adder 74 adapted to receive the signal, $V_u$, at one of its input ports. The second error cancellation branch of linearizer 60 includes an error cancellation vector modulator 70. The output port of vector modulator 70 is coupled to an input port of an auxiliary amplifier 72. The output port of auxiliary amplifier 72 is coupled to the other input port of error cancellation adder 74. Vector modulator 70 is configured to receive an error cancellation adjustment signal, $\beta$, such that after adjustment, the signal, $V_d$, generated at the output of adder 68 is substantially orthogonal to signal, $V_m$, generated at the output port of linearizer 60.

A digital signal processor 76 is configured to receive input signal, $V_m$, error signal, $V_d$, and the output signal $V_o$. The digital signal processor includes a down converter circuit 84, which is configured to shift the frequency range of signals, $V_m$, $V_d$ and $V_n$ into the baseband frequency range, although the invention is not limited in scope in that respect. For example, a separate down converter circuit, in accordance with another embodiment of the invention, first shifts the frequencies to the baseband range and then provides the down converted signals to digital signal processor 76.

The output port of down converter circuit 84 is coupled to a digital signal processing circuit 80, via A/D converter 92, which is configured to perform the necessary calculations to track the adjustment signals $\alpha$ and $\beta$. In accordance with one embodiment of the invention, digital signal processing circuit 80 is a dedicated processing integrated circuit chip, such as those available from Lucent Technologies, Inc, although the invention is not limited in scope in that respect. For example a dedicated microprocessor executing an appropriate software code can perform the same functions performed by processing circuit 80. A memory device 78 provides data information to digital signal processing circuit 80. The output port of digital signal processing circuit 80 is coupled to a digital to analog D/A converter 82, which converts the calculated parameters to analog signals. The output ports of digital to analog D/A converter 82 is coupled to vector modulators 66 and 70 for providing the analog versions of adjustment signals $\alpha$ and $\beta$ respectively.

Figure 3:
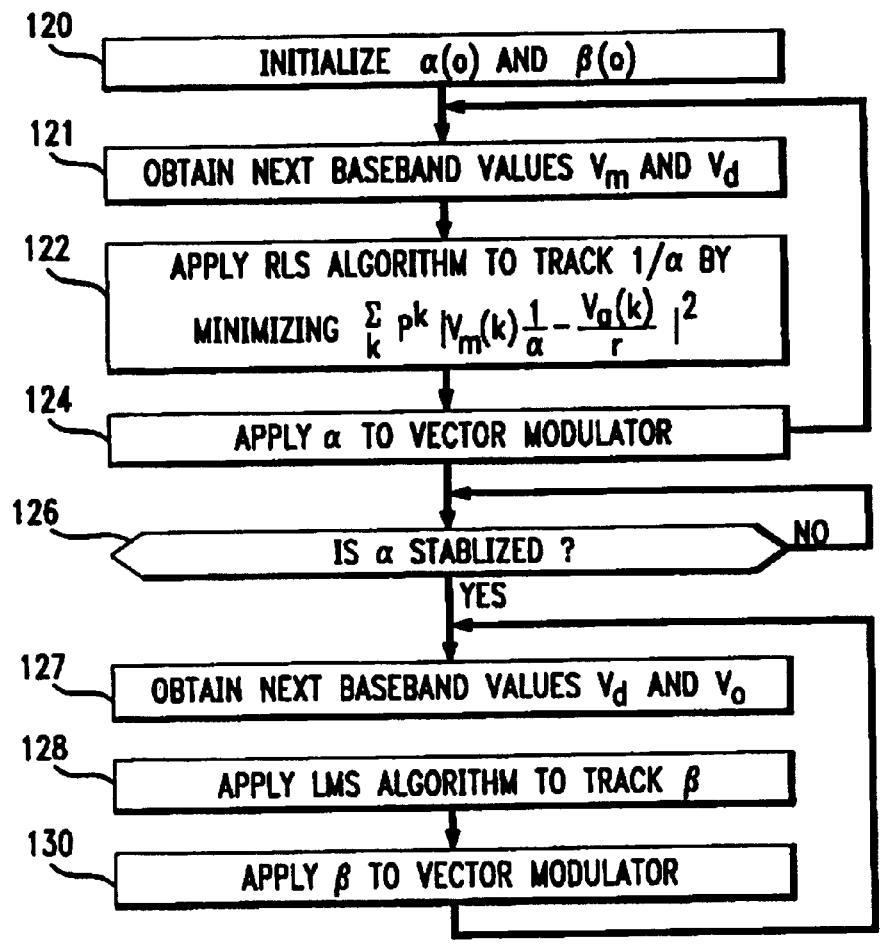
FIG. 3 illustrates a flow diagram of the steps taken by a digital signal processor employed by the feedforward linearizer illustrated in FIG. 2 in accordance with one embodiment of the present invention.

FIG. 3 is a flow chart illustrating the steps accomplished by digital signal processing circuit 80 in accordance with one embodiment of the invention, although the invention is not limited in scope in that respect. At step 120, processing circuit 80 initializes the values of $\alpha(0)$ and $\beta(0)$. At step 121, it obtains the baseband signals corresponding to input signal, $V_m$, error signal $V_d$ and linearizer output signal $V_o$, respectively.

At step 122, processing circuit 80 employs a Recursive Least Square algorithm to track an adjustment parameter $1/\alpha$, wherein $\alpha$ is the error cancellation adjustment signal. The Recursive Least Square algorithm is well known and described in S. Haykin, *Adaptive Filter Theory* (Prentice Hall 3d Ed. 1996), and incorporated herein by reference. The RLS algorithm solves a system of over-determined equations in a weighted least-square criterion as described in Haykin. The over-determined equations refer to the equations when the number are less than the number of linear equations and can be written as $$\rho^k V_m(k) \frac{1}{\alpha} = \rho^k \frac{V_a(k)}{r} = \rho^k \frac{V_d(k) + V_m(k)}{\alpha(k-1)} \alpha, \quad k = 1, 2, \ldots \infty \quad (1)$$

wherein $\rho$ is the reciprocal of the "forgetting factor" in the RLS algorithm, $V_m(k)$ is the signal sample at time k corresponding to the baseband version of the input signal to the linearizer, $V_d(k)$ is the signal sample at time k corresponding to the baseband version of the output signal of the signal cancellation circuit as provided by signal cancellation adder 68, $V_\alpha(k)$ is the signal sample at time k corresponding to the baseband version of the output signal of amplifier 62 $\alpha(k-1)$ is the known adjustment signal calculated in the previous update of $\alpha$, and r is the attenuation factor of attenuator 64. The RLS algorithm applied to equation (1) tracks $1/\alpha$ parameter by minimizing $$\sum_k \rho^k \left| \frac{V_d(k)}{\alpha} \right|^2 = \sum_k \rho^k \left| V_m(k) \frac{1}{\alpha} - \frac{V_a(k)}{r} \right|^2 \quad (2)$$

The RLS, algorithm can thus be summarized by the following recursive equations (3)–(6):

$$g(k) = \frac{\rho \phi(k) V_m(k)}{1 + \rho \phi(k) |V_m(k)|^2} \quad (3)$$

$$e(k) = \frac{V_d(k)}{\alpha(k-1)} \quad (4)$$

$$\alpha(k) = (\alpha^{-1}(k-1) + e(k) g^*(k))^{-1} \quad (5)$$

$$\phi(k+1) = \rho \phi(k)(1 - g(k) V_m^*(k)) \quad (6)$$

wherein the initial values $\alpha(1)=1\phi(1)=1$, and wherein g(k) in equation (3) is referred to as the "common gain vector", e in equation (4) is referred to as the "error vector," and $\phi$ in equation (6) is referred to as the "inverse of the data covariance." It is noted that there is no matrix operation in equations (3)–(6), since the number of the unknown parameter is only one. Thus, the solution of equations (3)–(6) may be calculated rather quickly. At step 126, signal processing circuit 80 waits until the value of $\alpha$ has stabilized. It is noted that the RLS algorithm is well known and described in S. Haykin, *Adaptive Filter Theory* (Prentice Hall 3d Ed. 1996), and incorporated herein by reference.

In accordance with another embodiment of the invention, processing circuit 80 employs a Least Means Square, LMS, algorithm to track the error cancellation adjustment signal $1/\alpha$. The LMS algorithm is well known and described in S. Haykin, *Adaptive Filter Theory* (Prentice Hall 3d Ed. 1996), and incorporated herein by reference. The Least Mean Square, LMS, algorithm can thus be summarized by the following recursive equation $$\alpha(k+1) = \alpha(k) - \mu_\alpha V_d(k) V_m^*(k) \quad (7)$$

wherein $\mu_\alpha$ is the step size employed in each iteration, until $\alpha$ is deemed substantially stabilized, by remaining constant for a specifiable number of iterations.

It is noted that employing a LMS algorithm may lead to a longer convergence time to track signal cancellation signal, $\alpha$, than the convergence time for tracking $\alpha$ by employing the RLS algorithm as described above. It is also noted that RLS algorithm employed by signal processing circuit 80 advantageously solve a set of linear equations to track the adjustment signal, $\alpha$. This follows because the signal cancellation vector modulator is located after amplifier 62 (FIG. 2). Putting the signal cancellation vector modulator before the amplifier results in non-linear equations in $\alpha$, and thus, makes it impossible to implement a simple RLS algorithm for tracking the adjustment signal, $\alpha$.

Because amplifier 62, attenuator 64 and vector modulator 66 are connected in series, both the linear and non-linear distortions generated by either attenuator 64 or vector modulator 66 can be treated as the distortions generated by amplifier 62, and thus can be corrected by linearizer 60 in accordance with a preferred embodiment of the invention as described herein.

It can be shown that by tracking the parameter $1/\alpha$ in accordance with equations 1–6 above, a substantially optimal $\alpha$ is derived in accordance with a preferred embodiment of the invention. As explained below, an alternative approach in tracking adjustment signal $\alpha$ leads to a suboptimal, but also acceptable, solution. Thus, it is possible to obtain a system of linear equations in terms of the input signal, $V_m$, error signal, $V_d$ and signal cancellation adjustment signal $\alpha$ as $$\rho^k \frac{V_a(k)}{r} \alpha = \rho^k \frac{V_d(k) + V_m(k)}{\alpha(k)} \alpha = \rho^k V_m(k), \quad k = 1 \ldots \infty. \quad (8)$$

Thus, accordingly to another embodiment of the invention the adjustment signal, $\alpha$, can be tracked by minimizing the power of the error signal, $V_d$, using a RLS algorithm, explained above. The RLS algorithm tracks adjustment signal, $\alpha$ by minimizing $$\sum_k \rho^k |V_d(k)|^2 = \sum_k \rho^k \left| \frac{V_a(k)}{r} \alpha - V_m(k) \right|^2 \quad (9)$$

However, solving equation (9) may not lead to an optimal result, and for some applications may not be appropriate, as explained hereinafter.

In view of the above descriptions, signal processing circuit 80 goes to step 127 to obtain the next baseband values for error signal $V_d$ and output signal $V_0$. Signal processing circuit 80 then calculates error cancellation adjustment signal, $\beta$, at step 128 by employing LMS algorithm. In error cancellation loop 88, the value of signal $\beta$ is adaptively adjusted to be equal to r/h, wherein r is the attenuation factor provided by attenuator 64 (FIG. 2) and h is the amplification factor of auxiliary amplifier 72 (FIG. 2). Both the attenuator and the auxiliary amplifier exhibit a substantially linear response, and as such respond independently from input signal statistics. As such, adjustment signal, $\beta$, is substantially insensitive to the fast-varying input signal variations and is deemed capable to tolerate a slower convergence algorithm, such as LMS algorithm for its derivation. Thus the value of $\beta$ is updated by $$\beta(k) = \beta(k-1) + \mu_\beta V_0(k) V_d^*(k) \quad (10)$$

wherein $\mu_\beta$ is the step-size employed in the calculations in accordance with the Least Mean Square, LMS, algorithm. It is noted that $\beta$ is intended to modulate the error signal, $V_d$, so that it has substantially no correlation with output signal $V_o$. At step 130 the value of $\beta$ is applied to modulator 70 in accordance with one embodiment of the invention. Thereafter, step 127 through 130 are repeated for each value of $V_d$ and $V_o$.

Figure 4A:
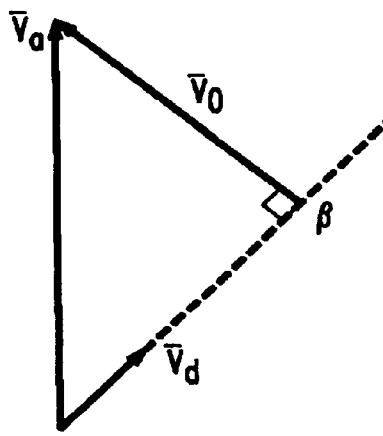
FIGS. 4a–4b illustrate a plot representing the convergence process for obtaining the amplitude and phase of adjustment signal, $\alpha$.
Figure 4B:
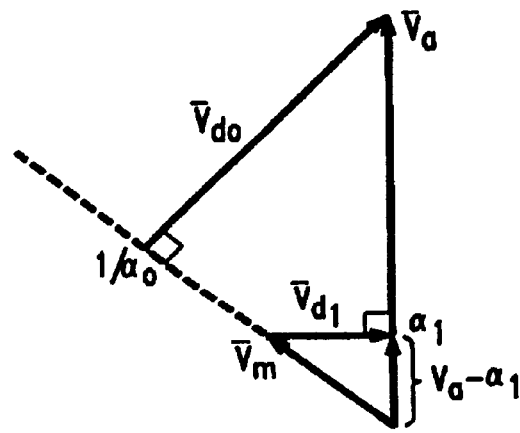

FIGS. 4(a) and 4(b) are vector diagrams that illustrate the significance of tracking an optimal adjustment signal in accordance with one embodiment of the present invention. Thus, FIG. 4(a) illustrates a vector diagram representing the operation of error cancellation circuit 88, and FIG. 4(b) illustrates a vector diagram representing the operation of signal cancellation circuit 86 with an optimal and sub-optimal solution for error control vector, $\vec{V}_d$, as described in more detail below.

Each signal as a function of time is represented by a column vector. Each signal may be sampled with a rate that is higher than twice the Nyquist rate times the highest non-linear order of amplifier. Typically the third or fifth non-linear order is considered relevant for the purposes of the present discussion. It is also noted that the high sampling rate is only for the purpose of analysis, and is not required in the algorithm explained in FIG. 2 in connection with a preferred embodiment of the present invention. Thus, the dimensions of each vector equals n, the total number of sampling points. Each entry of the vector denotes one sampled value. To this end, an inner product of two vectors can be defined as, for example, $1/n(\vec{V}_m^T \vec{V}_d)$. It is noted that as n approaches infinity, the inner product of two vectors representing input signal $V_m$ and error signal, $V_d$, becomes proportional to the cross-correlation of the corresponding two signals, i.e., $$\lim_{n \to \infty} \frac{1}{n}\left(\vec{V}_m^T \vec{V}_d\right) = cE(V_m V_d) \quad (11)$$

wherein "E" denotes the expectation over time, and c is a constant. Two vectors $\vec{V}_m$ and $\vec{V}_d$ are said to be perpendicular to each other when the inner product of these two vectors equals zero, or when signals $V_m$ and $V_d$ are uncorrelated.

FIG. 4(a) illustrates how the application of the Least Mean Square algorithm leads to an appropriate error cancellation adjustment signal, $\beta$, by minimizing the cross-correlation $E(V_o V_d)$, or by making output signal vector, $\vec{V}_o$, perpendicular to error signal vector, $\vec{V}_d$. An ideal linearizer 60 forces the output vector signal $\vec{V}_o$ be parallel to the amplifier 62 input vector signal, $\vec{V}_m$.

FIG. 4(b) which represents the vector arrangement for the signal cancellation circuit 86. Since in the error cancellation circuit 78 as illustrated in FIG. 4(a) output signal vector is perpendicular to error signal vector, adjustment signal, $\alpha$ and vector signal $\vec{V}_d$ in FIG. 4(b) must be adjusted such that output signal vector $\vec{V}_o$ is parallel to input signal vector $\vec{V}_m$. which in turn requires that error signal vector $\vec{V}_d$ is perpendicular to input signal vector $\vec{V}_m$. The sub-optimal criteria to minimize the power of error signal $V_d$ in signal cancellation loop 86 results in $\alpha = \alpha_1$ and $\vec{V}_d = \vec{V}_{d1}$. As illustrated the resultant vector signal $\vec{V}_{d1}$ is perpendicular to vector signal $\vec{V}_\alpha$, but is not perpendicular to $\vec{V}_m$ as desired.

Thus, as illustrated in FIG. 4(b) it is necessary to define an adjustment signal $\alpha$ that causes the desired orientation of an error signal in perpendicular relation to the input vector signal. One equation that governs signal cancellation circuit can be written as $V_d = (V_o/r.\alpha) - V_m$. By dividing both side by the adjustment signal $\alpha$, after weighting, it can be rewritten as $$\rho^k V_m(k)\frac{1}{\alpha} = \rho^k \frac{V_a(k)}{r} = \rho^k V_d(k) + \frac{V_m(k)}{\alpha(k-1)}, \quad k = 1, 2, \ldots \infty \quad (12)$$

which indicates that instead of adjustment signal $\alpha$, scaling factor $1/\alpha$ may be tracked. When the scaling factor $1/\alpha$ is included in the first signal cancellation circuit, it is possible to view linearizer 60 as if the scaling factor is multiplied by the input signal $V_m$ in the second branch of the signal cancellation circuit 86. Furthermore, it is possible to view linearizer 60 as if no scaling factor is being multiplied in the first signal cancellation branch, because, the multiplication of $1/\alpha$ by $\alpha$ results in a cancellation. As illustrated in FIG. 2(b), the scaling factor $1/\alpha$ can be adjusted so that the power $V_d/\alpha$ is minimized. This power minimization can be achieved when $\alpha = \alpha_0$ and $\vec{V}_d = \vec{V}_{d0}$, where $\vec{V}_{d0}$ is perpendicular to $\vec{V}_m$. As can be seen by defining adjustment signal $\alpha = \alpha_0$ the desired result that vector signal $\vec{V}_o$ is parallel to vector signal $\vec{V}_m$ is achieved. Thus, unlike equation (9), the Recursive Least Square algorithm applied to equation (12) tracks $1/\alpha$ by minimizing $$\sum_k \left|\frac{V_d(k)}{\alpha}\right|^2 = \sum_k \left|V_m(k)\frac{1}{\alpha} - \frac{V_a(k)}{r}\right|^2 \quad (13)$$

which is the same as equation (2) as described in connection with FIG. 2 assuming the reciprocal of the forgetting factor $\rho$ equals to one in accordance with a preferred embodiment of the present invention.

In order for signal cancellation vector modulator 66 and error cancellation vector modulator 70 operate satisfactorily, certain constraints are preferably followed as described hereinafter. Because the Recursive Least Square, RLS, algorithm directly calculates adjustment signal, $\alpha$, it invariably relies on vector modulator 66 to introduce the exact signal $\alpha$ calculated by signal processing circuit 80. The transfer function between the input control signal to vector modulator 66, $Ve^{j\theta}$ and the vector modulator complex signal gain $Ge^{j\theta}$ could be non-linear. As a result there may be no simple analytic function to describe this transfer function. However, the error introduced by the non-ideal vector modulator can be self-corrected as long as the vector modulator characteristics satisfy certain constraints as described more fully below.

The distortion generated by amplifier 62, attenuator 64 and vector modulator 66 in FIG. 2 are considered together through the measurements of the input signal $V_m$ and the error signal $V_d$. It is possible to treat vector modulator 66 as if functions ideally, and attribute all the distortions to the characteristics of amplifier 62. Thus, as far as linearizer 60 is concerned it is the amplifier that is causing the distortions, which can be corrected by following the steps described in FIG. 3 in accordance with a preferred embodiment of the invention.

Assuming that $Ve^{j\theta}$ is the optimal value of signal $\alpha$ as calculated by signal processing circuit 80 and $Ge^{j\theta}$ is the gain actually introduced by vector modulator 66, signal processing circuit 80 operates as if amplifier 62 has generated a gain which is more than its actual gain by a factor of G/V and has caused a phase shift which is more than its actual phase shift by an amount equal to φ−θ.

Figure 5A:
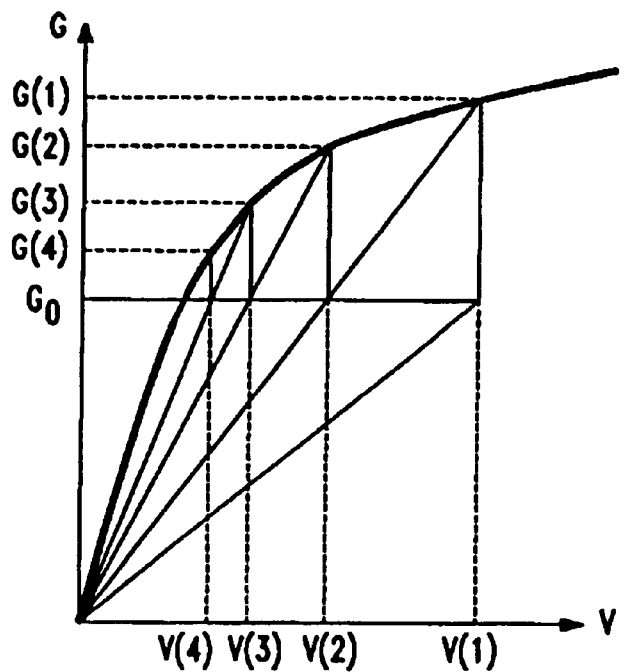
FIGS. 5a–5b illustrate transfer functions of a vector modulation in accordance with one embodiment of the invention.

FIG. 5(a) represents the transfer function between the magnitude of the input control signal α and the actual magnitude gain of the vector modulator 66 and $G_0$ is the optimal magnitude gain calculated by signal processing circuit 80. It is noted that the discussion in reference with FIG. 5 serves as an example to illustrate the convergence behavior. On the first trial, vector modulator 66 operates on (V(1), G(1)), where V(1)=$G_0$. Since the extra gain of G(1) over V(1) is attributed to amplifier 62, a line can be drawn from (V(1), G(1)) to the origin to represent the new ideal transfer function of vector modulator 66 after correction. This line intersects the horizontal line G=$G_0$ at (V(2), $G_0$). Signal processing circuit 80 then uses V(2) as the magnitude of the input control signal for its second trial. Following this procedure, vector modulator 66 magnitude gain G will finally converge to the correct value $G_0$ if $$\frac{dG}{dV} \leq \frac{G}{V} \quad (14)$$

Figure 5B:
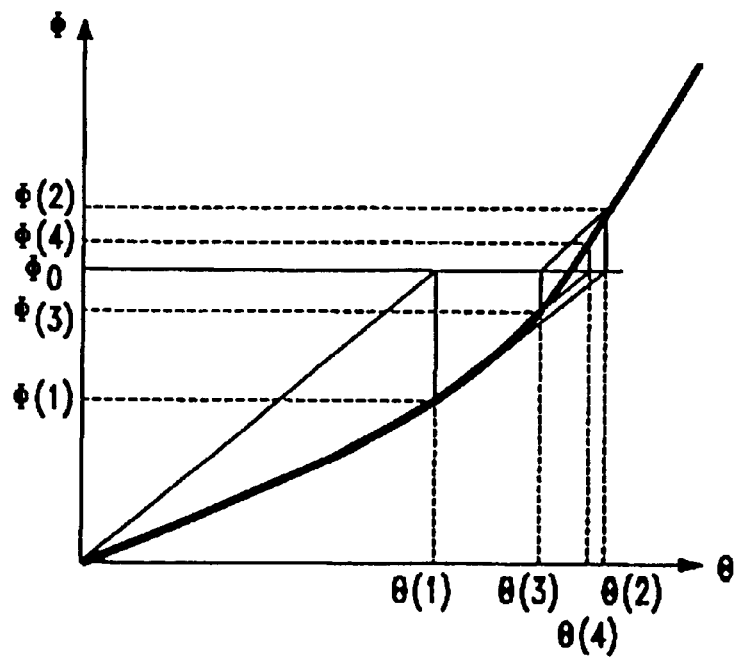

Similarly, as illustrated in FIG. 5(b), the phase shift error of vector modulator 66 can also be self-corrected. FIG. 5(b) illustrates the transfer function between the phase of the input control signal and the actual phase shift of vector modulator 66 and $\phi_0$ is the optimal phase shift calculated by signal processing circuit 80. On the first trial, vector modulator 66 operates on (θ(1), φ(1)), where θ(1)=$\Phi_0$. Attributing the phase error φ(1)−θ(1) to amplifier 62, a line along the 45° direction is drawn to represent the new ideal phase transfer function of vector modulator 66 after correction. This line intersects the horizontal line φ=$\phi_0$ at (θ(2), $\phi_0$). Then θ(2) is used as the phase of the input control signal for the second trial. Following this procedure, the phase shift of vector modulator 66 will converge to the correct value $\phi_0$ under the condition that $$\frac{1}{2} \leq \frac{d\phi}{d\theta} \leq 2 \quad (15)$$

Thus in accordance with a preferred embodiment of the invention the operating point of vector modulator 66 is biased such that both conditions (14) and (15) are maintained.

FIGS. 6(a)–6(f) illustrate simulation results of linearizer 60 in accordance with a preferred embodiment of the invention described above. For this simulation, the input signal consists of eight tones with unit amplitude which are placed 300 kHz apart one after another. The center frequency is 900 MHZ. Temperature and other environmental factors are assumed to be constants. An amplifier model used in the simulation contains both linear and nonlinear distortions, and can be described by a polynomial, $$V_a(k)=V_m(k)+0.1Vm(k-1)+0.05V^3_m(k).$$

Figure 6C:
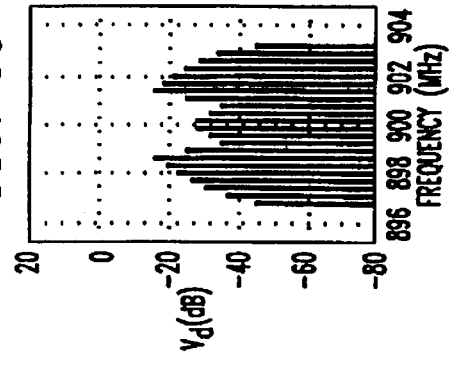
FIGS. 6a–6f illustrate the simulation results of the computations made by the signal processor in accordance with one embodiment of the present invention.
Figure 6B:
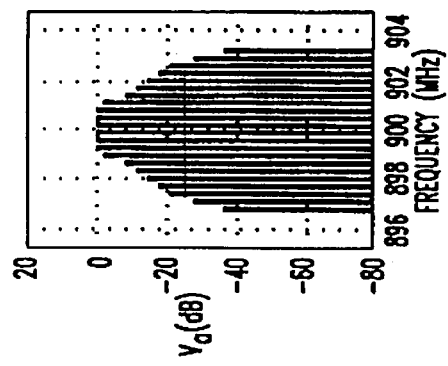
Figure 6A:
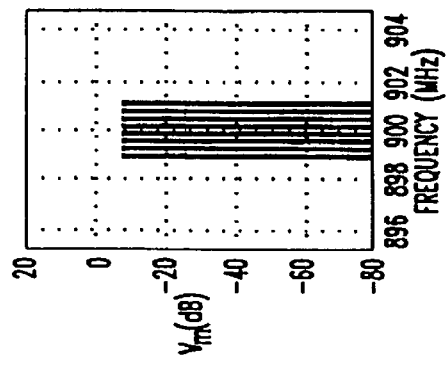
Figure 6F:
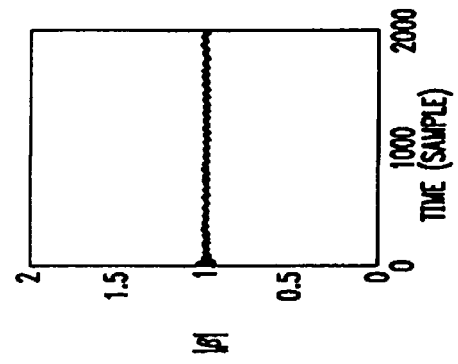
Figure 6E:
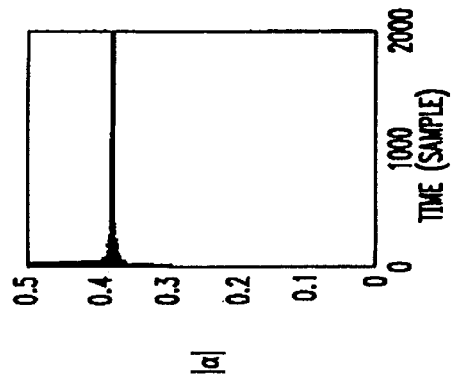
Figure 6D:
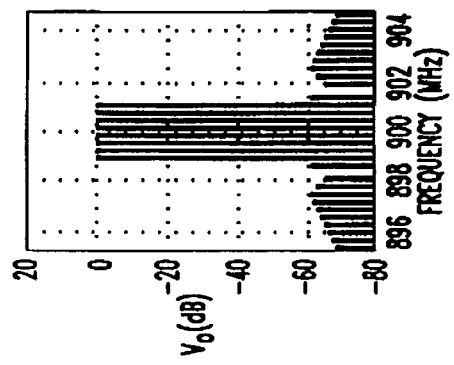

The operation of vector modulators are assumed to be perfect. It is also assumed that the initial value for β is correct. FIGS. 6(a)–6(d) show the frequency spectrum of input signal $V_m$, output signal of amplifier 62, $V_a$, error signal, $V_d$, and output signal, $V_0$. FIGS. 6(e) and 6(f) show the learning curves of α and β, respectively. As expected the tracking of α converges relatively quickly after few iterations, β does not drift far away from its initial value.

While only certain features of the invention have been illustrated and described herein, many modifications, substitutions, changes or equivalents will now occur to those skilled in the art. It is therefore, to be understood that the appended claims are intended to cover all such modifications and changes that fall within the true spirit of the invention.

We claim:

1. A feedforward linearizer for amplifying an input signal comprises: a signal cancellation circuit having a first signal cancellation branch and a second signal cancellation branch;
   a first amplifier provided in said first signal cancellation branch, said amplifier configured to receive said input signal intended to be amplified;
   a signal cancellation vector modulator coupled to said first amplifier, and configured to receive an output signal provided by said first amplifier;
   a signal cancellation adder coupled to said signal cancellation vector modulator and configured to receive the signal generated by said signal cancellation vector modulator, said signal cancellation adder configured to receive said input signal via said second signal cancellation branch and to provide an error signal;
   an error cancellation circuit having a first error cancellation branch and a second error cancellation branch;
   an error cancellation adder in said first error cancellation branch, said error cancellation adder configured to receive the output signal provided by said first amplifier; the output of said error cancellation adder provide the output signal of said linearizer;
   an error cancellation vector modulator in said second error cancellation branch, configured to receive said error signal provided by said signal cancellation adder and provide an error adjusted signal;
   a second auxiliary amplifier coupled to said error cancellation vector modulator configured to provide an input signal to said error cancellation adder;
   a digital signal processor comprising a signal processing circuit that is configured to calculate a signal cancellation adjustment signal, α, and an error cancellation adjustment signal, β, said digital signal processor configured to provide said signal cancellation adjustment signal, α, to said signal cancellation vector modulator and to provide said error cancellation adjustment signal, β, to said error cancellation vector modulator, such that the output signal of said signal cancellation adder is a signal that substantially represents the error components provided by said first amplifier, and the output signal of the error cancellation adder is an amplified version of the input signal, with substantially no intermodulation components.

2. The feedforward linearizer in accordance with claim 1 further comprising an attenuator coupled to said first amplifier and configured to receive said amplified signals provided by said first amplifier and attenuate said signals so as to provide an attenuated version of said amplified signals to said signal cancellation vector modulator.

3. The feedforward linearizer in accordance with claim 2, wherein said digital signal processor comprises a down converter coupled to said input signal of said amplifier, and said output signal of said signal cancellation adder and said output signal of said linearizer and configured to shift the frequency range of said input signal and said output signals into a baseband range.

4. The feedforward linearizer in accordance with claim 3, wherein said digital signal processor further comprises an analog to digital converter coupled to said down converter and configured to sample said downconverted input signal of said amplifier, said output signal of said signal cancellation adder and said output signal of said linearizer.

5. The feedforward linearizer in accordance with claim 4, wherein sad digital signal processor comprises a Recursive Least Square, RLS, calculator that tracks a parameter $1/\alpha$, wherein $\alpha$ is said signal cancellation adjustment signal, such that said error signal is substantially orthogonal to said input signal, received by said amplifier.

6. The feedforward linearizer in accordance with claim 4, wherein said Recursive Least Square, RLS, calculator solves a system of linear equations $$\rho^k V_m(k)\frac{1}{\alpha} = \rho^k \frac{Va(k)}{r} = \rho^k \frac{V_d(k)+V_m(k)}{\alpha}(k), \quad k=1,2,\ldots\infty$$

wherein $V_m(k)$ represents said signal samples corresponding to said input signal, $V_\alpha(k)$ represents signal samples corresponding to said output of said amplifier, and $V_d(k)$ represents said signal samples corresponding to said error signal, r is the attenuation factor of said attenuator and $\alpha$ is said signal cancellation adjustment signal.

7. The feedforward linearizer in accordance with claim 6, wherein said Recursive Least Square algorithm tracks a parameter $1/\alpha$ by minimizing $$\sum_k \rho^k \left|\frac{V_d(k)}{\alpha}\right|^2 = \sum_k \rho^k \left|V_m(k)\frac{1}{\alpha} - \frac{V_a(k)}{r}\right|^2$$

where $\rho$ is the reciprocal of said forgetting factor in Recursive Least Square algorithm.

8. The feedforward linearizer in accordance with claim 4, wherein said digital signal processor comprises a Least Mean Square calculator that calculates said adjustment signal, $\beta$ by employing a Least Square means algorithm.

9. An integrated circuit comprising a feedforward linearizer in accordance with claim 1.

10. In a feedforward linearizer a method for linearizing an amplifier by deriving an error signal corresponding to distortions deemed generated by said amplifier, and applying an adjusted version of said error signal to the output signal of said amplifier so as to provide a substantially error free amplified version of said output signal, said method comprising the steps of:
  (a) calculating a signal cancellation adjustment signal such that said error signal resulting from said signal cancellation adder is substantially orthogonal to said input signal;
  (b) multiplying said calculated signal cancellation adjustment signal to said output signal of said amplifier so as to derive an adjusted output signal of said amplifier; and
  (c) calculating a difference between said adjusted output signal and said input signal so as to derive said error signal.

11. The method in accordance with claim 10, wherein said step of calculating said signal cancellation adjustment signal comprises the steps of:
  measuring the baseband signal samples representing the input signal provided to said amplifier, and the output signal provided by said amplifier, and said error signal; and
  solving for said signal cancellation adjustment signal by minimizing $$\sum_k \rho^k \left|\frac{V_d(k)}{\alpha}\right|^2 = \sum_k \rho^k \left|V_m(k)\frac{1}{\alpha} - \frac{V_a(k)}{r}\right|^2$$

wherein $V_m(k)$ represents said signal samples corresponding to said input signal, $V_\alpha(k)$ represents signal samples corresponding to said output of said amplifier, and $V_d(k)$ represents said signal samples corresponding to said error signal, r is the attenuation factor of said attenuator and $\alpha$ is said sinal cancellation adjustment signal.

12. The method in accordance with claim 11, wherein said step of solving for said adjustment signal comprises the step of applying a Recursive Least Square algorithm to solve $$g(k) = \frac{\rho\,\phi(k)V_m(k)}{1+\rho\,\phi(k)|V_m(k)|^2}$$

$$e(k) = \frac{V_d(k)}{\alpha(k-1)}$$

$$\alpha(k) = (\alpha^{-1}(k-1) + e(k)g^*(k))^{-1}$$

$$\phi(k+1) = \rho\,\phi(k)(1 - g(k)V_m^*(k))$$

wherein the initial values $\alpha(1)=1\phi(1)=1$, and wherein $g(k)$ is referred to as the "common gain vector", e is referred to as the "error vector," and $\phi$ is referred to as the "inverse of the data covariance."

13. The method in accordance with claim 10, wherein said step of calculating said signal cancellation adjustment signal comprises the steps of
  measuring the baseband signal samples representing the input signal provided to said amplifier, and the output signal provided by said amplifier; and
  solving for said signal cancellation adjustment signal by applying a Least Mean Square algorithm.

14. The method in accordance with claim 13 wherein said solving step further comprises the step of recursively calculating $$\alpha(k)=\alpha(k-1)-\mu_\alpha V_d(k)V^*_m(k)$$

wherein $\mu$ is the step size employed in each iteration, $V_d$ corresponds to said error signal and $V^*_m$ represents a complex conjugate of said input signal of said linearizer.

15. The method in accordance with claim 14 wherein $$\frac{dG}{dV} \le \frac{G}{V}$$

wherein G is the gain of the vector modulator and V is the input signal to the modulator and $$\frac{1}{2} \le \frac{d\phi}{d\theta} \le 2$$

wherein $\phi$ is the phase of the input signal to the vector modulator and $\theta$ is the phase of the output signal of the vector modulator.

16. The method according to claim 10, further comprising:
  calculating an error cancellation adjustment signal; and
  multiplying said error signal with said error cancellation adjustment signal, so as to derive said adjusted version of said error signal such that said adjusted version of said error signal has substantially no correlation with said output signal of said amplifier.

* * * * *